US008294043B2

(12) United States Patent
Munoz et al.

(10) Patent No.: US 8,294,043 B2
(45) Date of Patent: Oct. 23, 2012

(54) INTEGRATED CONNECTOR SHIELD RING FOR SHIELDED ENCLOSURES

(75) Inventors: Raul Munoz, Covina, CA (US); Steven Shimotani, Rancho Palos Verdes, CA (US); Evgeni Ganev, Torrance, CA (US)

(73) Assignee: Honeywell International Inc., Morristown, NJ (US)

( * ) Notice: Subject to any disclaimer, the term of this patent is extended or adjusted under 35 U.S.C. 154(b) by 206 days.

(21) Appl. No.: 12/962,492

(22) Filed: Dec. 7, 2010

(65) Prior Publication Data

US 2012/0138355 A1 Jun. 7, 2012

(51) Int. Cl.
*H01R 13/648* (2006.01)
*H05K 9/00* (2006.01)

(52) U.S. Cl. .................. 174/359; 174/380; 439/607.14; 439/607.28

(58) Field of Classification Search ............. 439/607.14, 439/607.28; 174/359, 380; 361/816
See application file for complete search history.

(56) References Cited

U.S. PATENT DOCUMENTS 4,720,770 A * 1/1988 Jameson ........................ 361/705
5,064,388 A * 11/1991 Paladel .................... 439/607.23
5,308,264 A 5/1994 Perretta et al.
5,696,669 A * 12/1997 Bassler et al. ................ 361/816
6,280,208 B1 * 8/2001 Masuda et al. .................. 439/98
6,385,054 B1 * 5/2002 Vesamaki et al. ............. 361/816
6,580,028 B1 * 6/2003 Mellberg et al. .............. 174/359
6,858,793 B1 * 2/2005 Pels et al. ...................... 174/359
7,215,558 B2 5/2007 Schultz et al.
2002/0076978 A1 6/2002 Meyer et al.
2003/0111243 A1 * 6/2003 Lindberg et al. ............ 174/35 R
2009/0126985 A1 * 5/2009 Aoki et al. .................... 174/377
2010/0149759 A1 6/2010 Nguyen

FOREIGN PATENT DOCUMENTS

EP 1365485 A1 11/2003
EP 1923965 A1 5/2008
GB 1402861 8/1975
WO WO 2007027884 3/2007

* cited by examiner

*Primary Examiner* — Hung Ngo
(74) *Attorney, Agent, or Firm* — Shimokaji & Assoc., PC

(57) ABSTRACT

Methods and apparatus for shielding enclosures having connector apertures result in effective electromagnetic isolation of the electromagnetic environment internal to a shielded enclosure from the external environment. Embodiments of the present invention may also accommodate the effective implementation of a low cost filter pin connector. An integrated shield ring may create an EMI doghouse with a metal ring that attaches onto a bulkhead board mounted connector that is bonded to a circular chassis ground plane on a printed wiring board (PWB) assembly.

20 Claims, 7 Drawing Sheets

INTEGRATED CONNECTOR SHIELD RING FOR SHIELDED ENCLOSURES

BACKGROUND OF THE INVENTION

The present invention relates to apparatus and methods for electromagnetic interference shielding and, more particularly, to apparatus and methods for sealing apertures created by connectors in shielded enclosures.

There are many systems with very high frequency clocks and oscillators that generate high frequency emissions which radiate out from circuit cards and then out of the electronic shielded enclosures through the connector apertures, which are the largest apertures in shielded enclosures. The use of EMI shielded enclosures made of metallic materials or coated with metallic material is very commonly used in aerospace applications for the control of radiated emissions. Electromagnetic interference (EMI) shielding by a metallic wall is very effective, even for very thin walls, such as sprayed or brushed on metallic coats or foil sheets. The equation for shielding effectiveness is given by the following formula (I)

$$SE=A+R-B \quad (I)$$

where

SE is the shielding effectiveness of the metal shield,

A=absorption loss,

R=reflection loss, and

B=multiple reflection loss.

The multiple reflection loss is only applicable to very thin metallic sheets, such as aluminum foil or spray on metallic coatings. The shielding effectiveness of a thin foil sheet is shown in FIG. 1. Note that the near field is considered when distance from the source to the shield is less than $\lambda/2\pi$. Even at the highest frequency of interest of approximately 1 gigahertz (GHz), $\lambda/2\pi\approx1.9$ inches. So the shielded enclosure walls are in the near field of sources within the enclosure.

Sources can be either electric, such as high impedance voltage sources, or magnetic, such as low impedance current loops, but most sources are neither purely electric nor magnetic. Note that in FIG. 1, the near field magnetic attenuation is very low. However, most sources of interest are primarily electric, such as high impedance clock traces. For these primarily electric field sources, the aluminum shield provides a very high degree of attenuation, as compared to the far field plane wave attenuation. Thus, using the far field plane wave attenuation provides a good safety margin for most noise sources encountered. This would not be the case for low frequency magnetic fields.

One of the greatest limitations of metallic shielded enclosures is the input/output (I/O) interfaces. The connectors and other apertures required for I/O signals to enter and exit the shielded enclosure create breaches in the shielded enclosure, allowing the electromagnetic energy to enter and exit the shielded enclosure. Connectors typically have a dielectric insert where the connector pins are mounted. This insert creates an aperture with an electrical length equal to the greatest dimension of the connector opening L1 as shown in FIG. 2A for a circular connector. This is not a problem for low frequency signals since the diameter is very small compared to the wavelength of the signal and the shielding effectiveness is governed by formula (II)

$$SE=20\log(\lambda/2L) \quad (II)$$

where

SE is the aperture shielding effectiveness,

L is the longest dimension of the aperture,

λ is c/f, where c is the speed of light, and f is the frequency of the noise source.

Thus, as shown in FIG. 3, at low frequencies, connector apertures provide a greater shielding effectiveness than the metallic material plane wave attenuation. As the frequency increases, however, the shielding effectiveness of the connector aperture eventually decreases below the material attenuation and limits the maximum attenuation of the enclosure. Above the frequency where $\lambda=2\times L$, the aperture will not provide any attenuation.

With the advent of higher and higher frequency systems, I/O apertures have become a greater source of radiation. Periodic signals expand into Fourier series expansions at harmonics of the primary frequency of the time domain signal. Therefore, periodic signals, such as clocks and switching sources, will have high frequency harmonics that will radiate out of the connector apertures with little or no attenuation. This effect could be mitigated by placing a metallic chassis ground ring over the connector aperture, as shown in FIG. 2B. By having many smaller holes, with a diameter L2, rather than one large hole, with a diameter L1, the shielding effectiveness of the aperture is increased.

The equation for the effects of multiple holes is formula (III) below. The composite aperture shielding effectiveness as compared to that of the single connector aperture is also shown in FIG. 3 for nineteen 60-mil apertures. The net increase in shielding effectiveness is 11.2 dB for this configuration.

$$SE=20\times\log(\lambda/2L)-20\times\log(N^{1/2}) \quad (III)$$

where

SE is the composite aperture shielding effectiveness,

L is the longest dimension of the individual apertures, and

N is the number of apertures.

The aperture electromagnetic radiation leakage effect forces designers to address the radiation from I/O apertures. The most common way to address the I/O interface electromagnetic radiation leakage is with an EMI doghouse. The EMI doghouse is a method of closing off the aperture leakage with a secondary compartment within the shielded enclosure which has a metallic interface. The EMI doghouse has traditionally required the creation of a mechanical barrier that must be formed or machined into the housing. The interface must then be connectorized or fitted with feed through filters to pass the interconnect signals from the shielded portion of the enclosure to the unshielded portion. This can add a great deal of cost and complexity to the enclosure.

As can be seen, there is a need for mitigating the electrical radiation through connector apertures in shielded enclosures.

SUMMARY OF THE INVENTION

In one aspect of the present invention, an integrated connector shield ring for shielding an aperture in a shielded enclosure comprises a chassis ground ring on a printed wiring board; and a metal ring having a first end electrically connected to an exterior of a connector in the aperture and a second end adapted to electrically connect to the chassis ground ring, wherein the metal ring is adapted to move from an up/inspection position to a down/shielding position.

In another aspect of the present invention, a shielded enclosure having an aperture with a connector comprises a printed wiring board; a chassis ground ring on the printed wiring board; and a metal ring having a first end electrically connected to an exterior of the connector and a second end adapted to electrically connect to the chassis ground ring, wherein the metal ring is adapted to move from an up/inspection position to a down/shielding position.

In a further aspect of the present invention, a shielded enclosure having an aperture with a filterpin connector comprises a printed wiring board; a chassis ground ring on the printed wiring board; a metal ring having a first end electrically connected to an exterior of the connector and a second end adapted to electrically connect to the chassis ground ring; and filtering components disposed on the printed wiring board thereby creating a filterpin connector from the connector, wherein the metal ring is adapted to move from an up/inspection position to a down/shielding position.

These and other features, aspects and advantages of the present invention will become better understood with reference to the following drawings, description and claims.

DETAILED DESCRIPTION OF THE INVENTION

The following detailed description is of the best currently contemplated modes of carrying out exemplary embodiments of the invention. The description is not to be taken in a limiting sense, but is made merely for the purpose of illustrating the general principles of the invention, since the scope of the invention is best defined by the appended claims.

Various inventive features are described below that can each be used independently of one another or in combination with other features.

Broadly, embodiments of the present invention provide methods and apparatus for shielding enclosures having connector apertures, resulting in effective electromagnetic isolation of the electromagnetic environment internal to a shielded enclosure from the external environment. Embodiments of the present invention may also accommodate the effective implementation of a low cost filter pin connector. An integrated shield ring may create an EMI doghouse with a metal ring that attaches onto a bulkhead board mounted connector that is bonded to a circular chassis ground plane on a printed wiring board (PWB) assembly.

Figure 1:
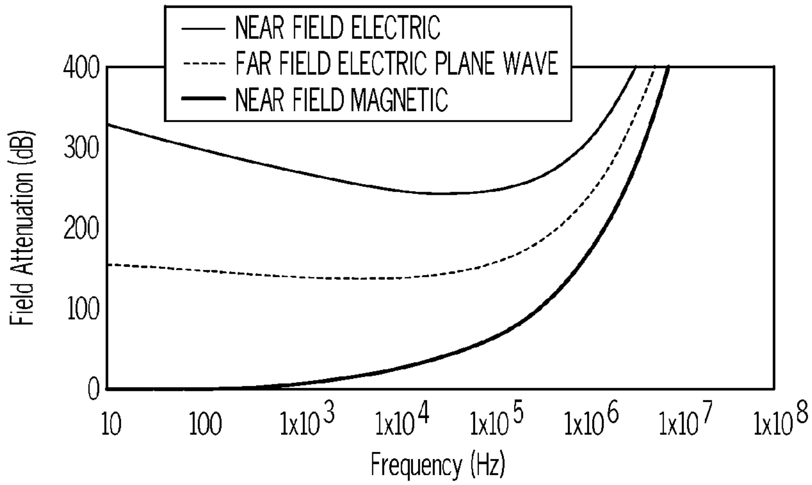
FIG. 1 is graph showing the shielding effectiveness of a 60-mil aluminum sheet for various forms of energy.
Figures 2A, 2B:
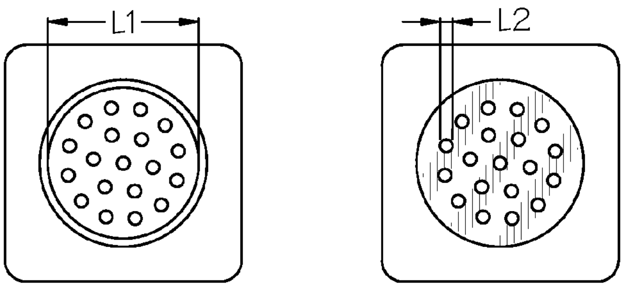
FIG. 2A is a front view of a connector aperture.
FIG. 2B is a front view of another connector aperture.
Figure 3:
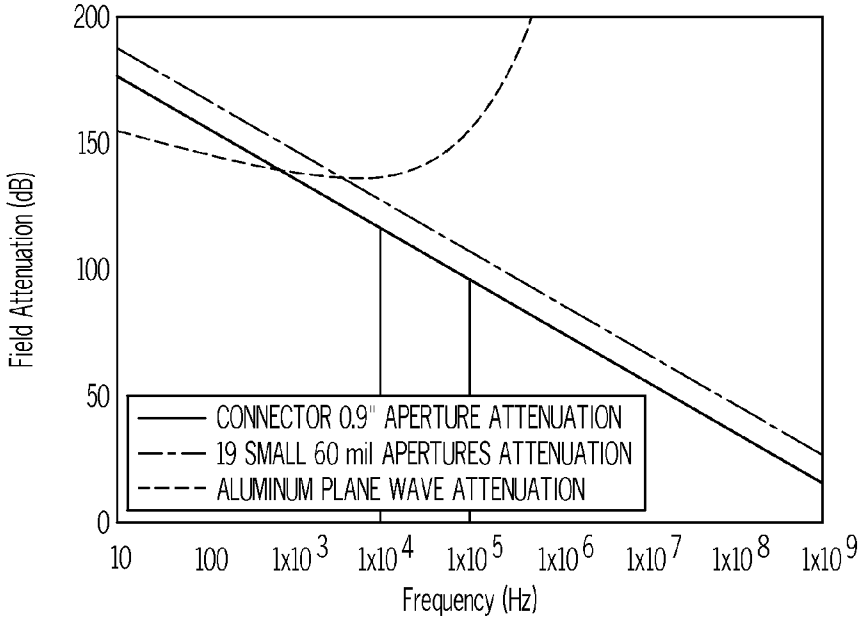
FIG. 3 is a graph showing the shielding effectiveness of connectors with and without shielded apertures versus metallic enclosure shielding.
Figure 4:
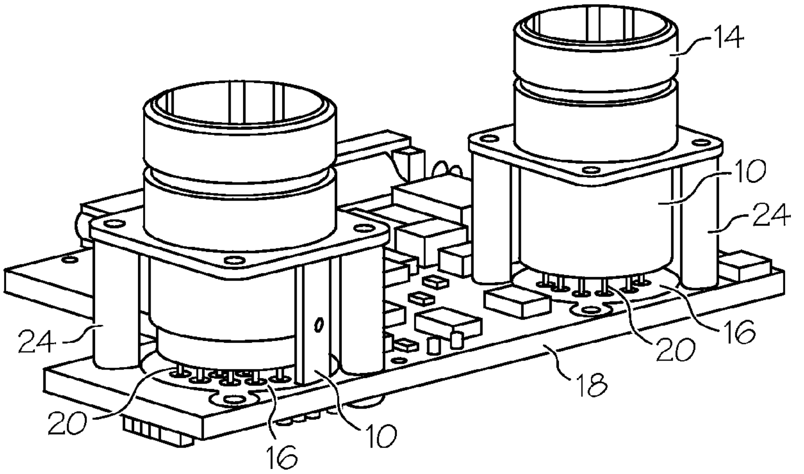
FIG. 4 is a perspective view of an application of an integrated connector shield ring (ISR) in an up position, according to an embodiment of the present invention.
Figure 5:
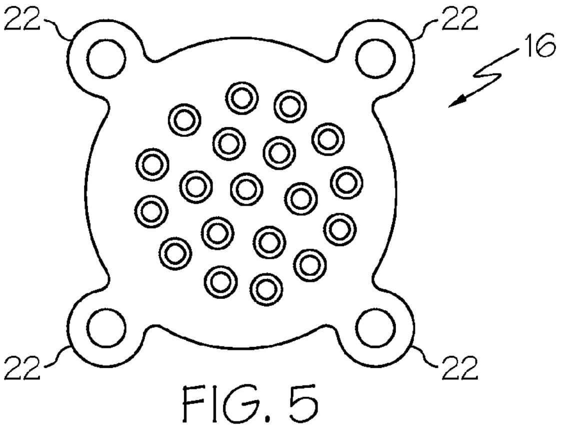
FIG. 5 is front view of a chassis ground ring used with the integrated connector shield ring of FIG. 4.
Figure 6:
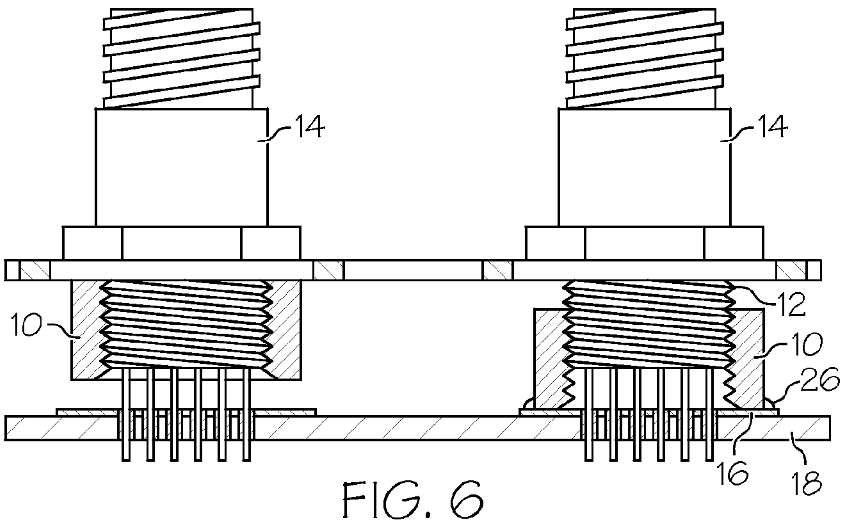
FIG. 6 is a partially cut-away view of the ISR of FIG. 4 in an up position (left-hand side) and a threaded-down position (right-hand side)

Referring to FIGS. 4 and 5, an integrated shield ring (ISR) 10 will create an EMI doghouse with the threads 12 on a bulkhead board mounted connector 14 (see FIG. 6). The ISR 10 is bonded to a circular chassis ground ring 16 on a printed wiring board (PWB) 18. The chassis ground ring 16 may be a circular ground plane with circular holes for penetration of connector pins 20. The chassis ground ring 16 may have integrated stand-off pads 22 to facilitate the grounding of the ring 16 through stand-offs 24. In FIG. 4, the ISR 10 is shown as a partial view on the left-hand side. Both ISRs 10 in FIG. 4 are in an "up for inspection" position.

Figure 7:
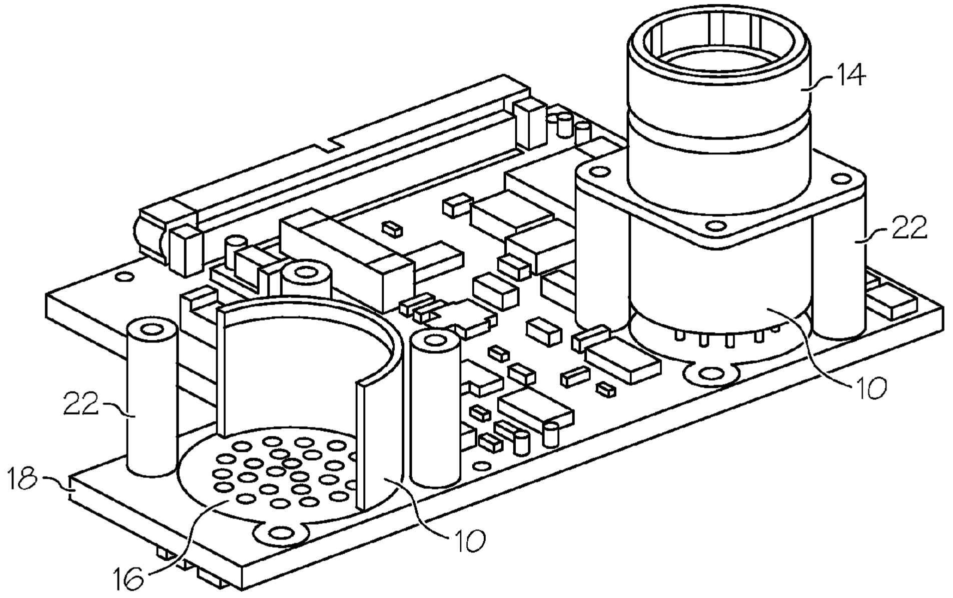
FIG. 7 is a perspective view of the ISR of FIG. 4, partially cut-away in the threaded-down position (left-hand side) and in an up position (right-hand side)

Referring to FIGS. 6 and 7, prior to assembly on the PWB 18, the ISR 10 may be screwed all the way up the bulkhead board mounted connector threads 12, as shown on the left-hand connector in FIG. 6. Once the connector 14 is mounted and the soldering is inspected, the ISR 10 may be threaded down until it makes contact with the chassis ground ring 16 on the PWB 18 as shown on the right-hand connector in FIG. 6. The contact between the ISR 10 and the chassis ground ring 16 is also shown in the cut-out section on the left-hand connector of FIG. 7. As the ISR 10 is tightened down against the chassis ground ring 16, pressure may be exerted between the ISR 10 and the threads of the bulkhead board mounted connector threads 12, providing an effective shield along the length of threaded contact between the ISR 10 and the bulkhead board mounted connector threads12.

Figure 8:
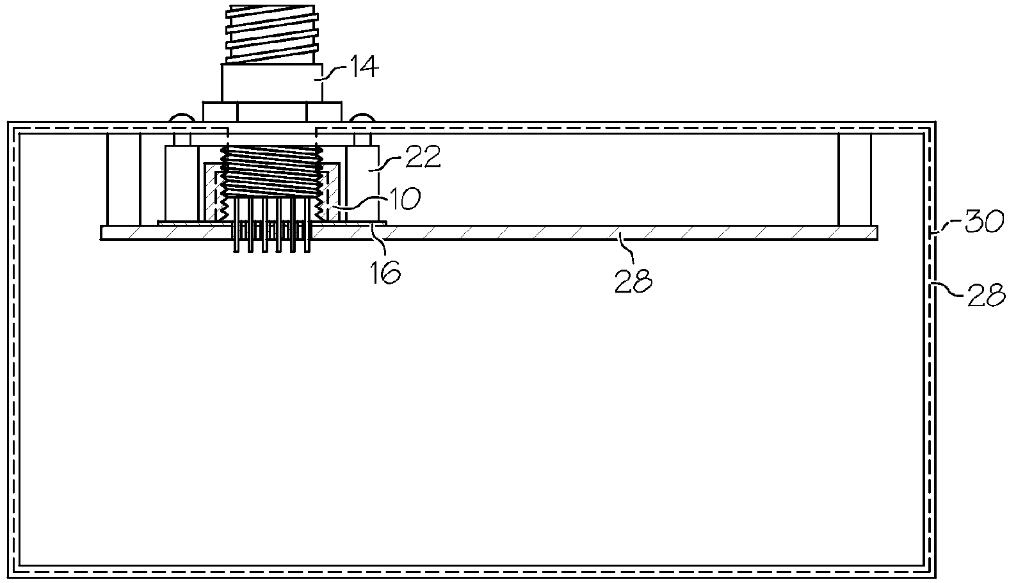
FIG. 8 is partially cut-away view of the ISR of FIG. 4 installed in a shielded enclosure.

Once the ISR 10 is in place, it may be bonded to the circular chassis ground ring 16 with, for example, conductive epoxy 26, as shown in FIG. 6. This helps assure that the ISR 10 does not un-thread back onto the bulkhead board mounted connector threads12 and lose good electrical bonding between the ISR 10 and the chassis ground ring 16 on the PWB 18. This helps create a continuous electrically conductive path between all components when assembled into a shielded enclosure 28, as shown in FIG. 8. A dashed line 30 represents the interface between the Faraday cage and the unshielded exterior of the enclosure 28.

Figure 9A:
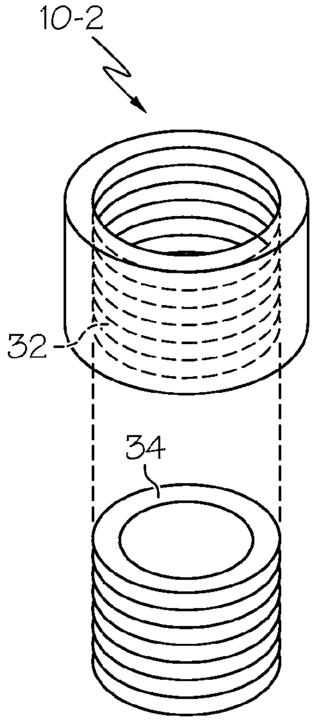
FIG. 9A shows an exploded view of an ISR according to an alternate embodiment of the present invention.
Figure 9B:
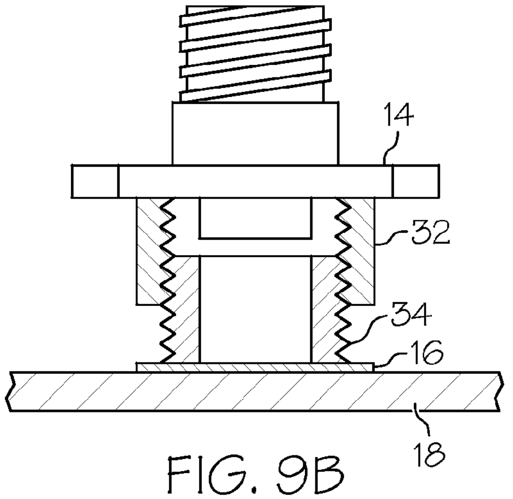
FIG. 9B shows the ISR of FIG. 9A installed with a connector.
Figure 10A:
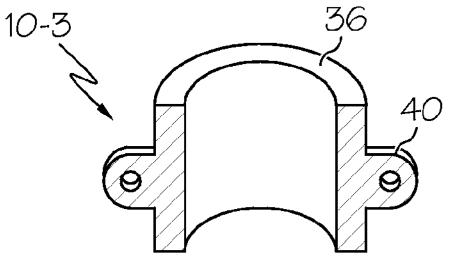
FIG. 10A shows a cross-sectional view of an ISR according to another alternate embodiment of the present invention.
Figure 10B:
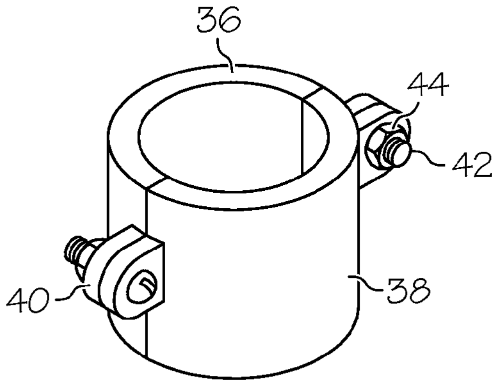
FIG. 10B shows a perspective view of the ISR of FIG. 10A.
Figure 10C:
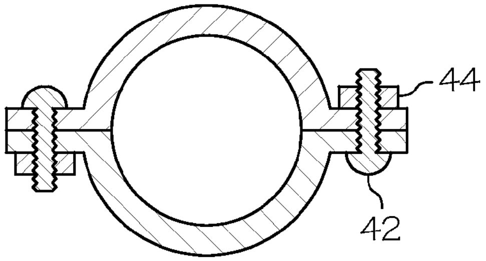
FIG. 10C shows a plan view of the ISR of FIG. 10A.
Figure 10D:
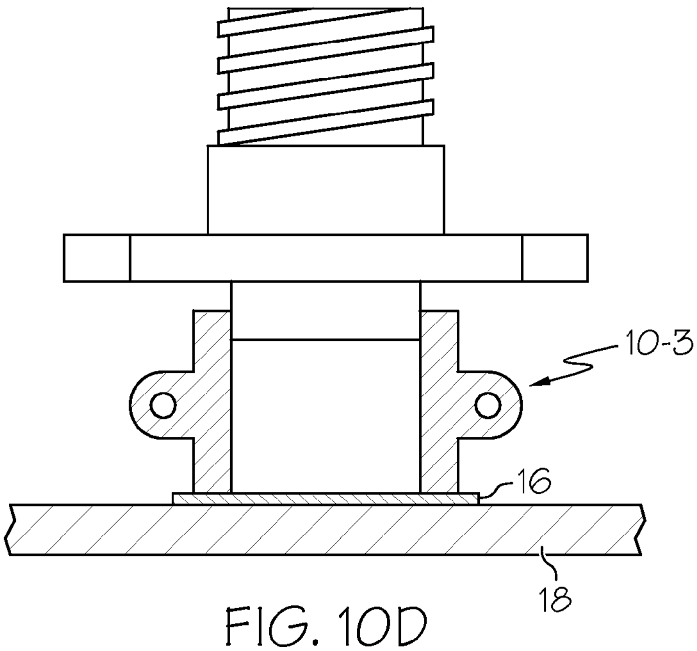
FIG. 10D shows the ISR of FIG. 10A installed with a connector.

While the above FIGS. 4 through 8 describe the ISR 10 as an internally threaded ring that threads on the bulkhead board mounted connector threads 12 of the connector 14, other configurations of the ISR 10 are included within the scope of the present invention. For example referring to FIGS. 9A and 9B, a two-ring ISR 10-2 may include an internally threaded ring 32 and an externally threaded ring 34 adapted to be threaded onto the internally threaded ring 32. The threaded rings 32, 34 may be turned to provide an electrical connection between the connector and the chassis ground ring 16, similar to the ISR 10 described above.

Referring to FIGS. 10A through 10D, in another alternative embodiment, an ISR 10-3 may be formed from multiple components adapted to be attached together. For example, the ISR 10-3 may include a first half ring 36 and a second half ring 38. Each half ring may include ears 40 for connecting the half rings together. Conventional means, such as a bolt 42 and nut 44 may be used to join the half rings together.

Figure 11:
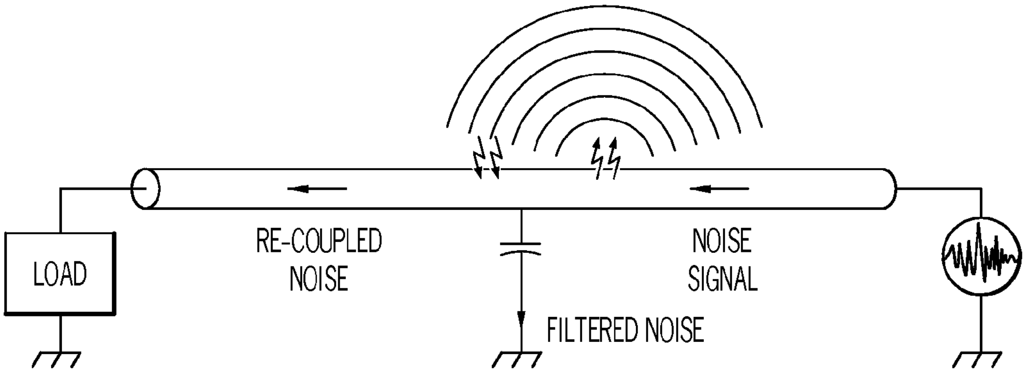
FIG. 11 is schematic view of re-coupling of filtered noise.
Figure 12:
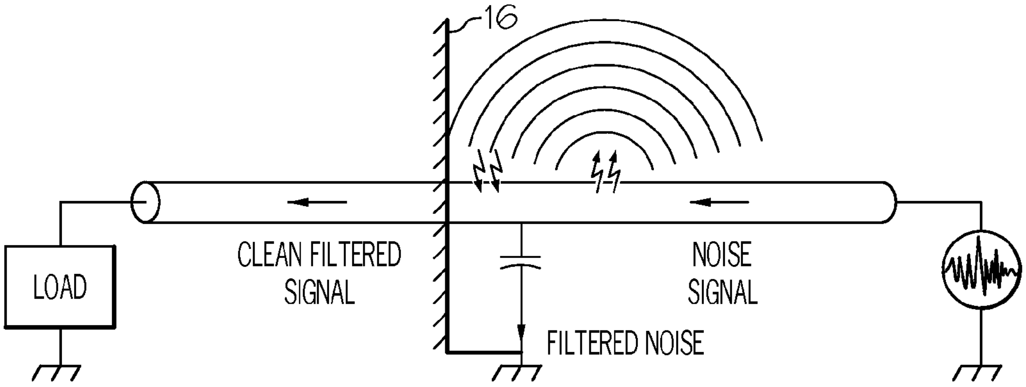
FIG. 12 is a schematic view showing the elimination of filtered noise re-coupling using a shield barrier according to an embodiment of the present invention.

Electromagnetic noise emissions can be radiated into or out of a shielded enclosure by two different mechanisms. The emissions can radiate from circuitry on the board and then radiate out of the shielded enclosure through apertures in the enclosure, such as connector holes or seams. Similarly, external emissions could radiate into the inside of the shielded enclosure through the same apertures. The ISR may be very effective in controlling emissions radiated directly from the board by eliminating the connector apertures, which are typically the main leakage point in a shielded enclosure. However, emissions could also conduct into or out of the shielded enclosure through the I/O interface cables. External fields that couple onto the I/O cable will conduct into the unit and, similarly, EMI noise that conducts out of the unit on the I/O cable will radiate off the cable external to the shielded enclosure, thus bypassing the ISR. The emissions from currents on the I/O interface cable could be mitigated by adding filtering components on the PWB right before the board trace interfaces with the connector pins. This, in essence, creates a filterpin connector. One of the most effective filtering configurations is the trace-to-chassis capacitor. However, since this configuration has a clean and a noisy side, as shown in FIG. 11, re-coupling could occur, greatly reducing the effectiveness of the filtering. However, the chassis ground ring 16 in the ISR configuration, as described above, may create a barrier between the noisy section of the signal and the clean section, as shown in FIG. 12, effectively eliminating the re-coupling. This is especially effective at higher frequencies.

Note that, unlike with standard filter pin connectors where very small components must be used, the size of the ISR configuration filtering components is limited only by space on the PWB and proximity to the point where the trace connects to the connector pin. If this distance is not kept to a minimum, re-coupling onto the filtered trace is increased, which will again degrade the benefit of the barrier. This may allow the use of larger value and voltage rating components for filtering. This may provide a very important benefit over the limitations of conventional filterpin connectors.

Figure 13:
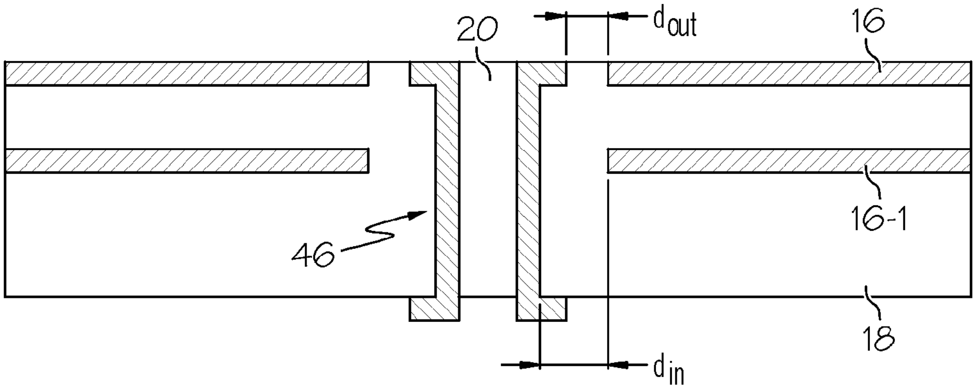
FIG. 13 is a cross-sectional view of a chassis ground ring layer on the inner versus the outer layer of a printed wiring board.

The connector pin-to-chassis ground ring distance, shown as dout in FIG. 13, should be adequate to withstand voltage stress effects. There are different standards for the volts/mil between the different components, such as trace-to-trace, trace-to-chassis and pin-to-chassis on the surface of the board. Therefore, the maximum voltage allowable on I/O pins relative to chassis will be limited by the distance between the chassis ground ring 16 and the connector pins 20. The maximum voltage allowable between the connector pin 20 and the chassis ground ring 16 may be increased by increasing the dout dimension. Alternatively, the volts/mil rating could be increased by burying a chassis ground ring 16-1 on an internal layer of the PWB 18, where the volts/mil rating is much higher for buried layers than on the outer layers. There may be a second benefit of burying the chassis ground ring 16-1 in that, for an equivalent diameter connector hole in the chassis ground ring 16-1, the distance between the connector pin 20 and the chassis ground ring 16-1 may be increased because connector pin vias 46 have a slightly larger diameter on the outer layer, as shown in FIG. 13, where din>dout for an equivalent diameter hole. Thus, some configurations with a higher dielectric withstanding voltage or lightning voltage requirements may need a buried chassis ground ring.

Figure 14:
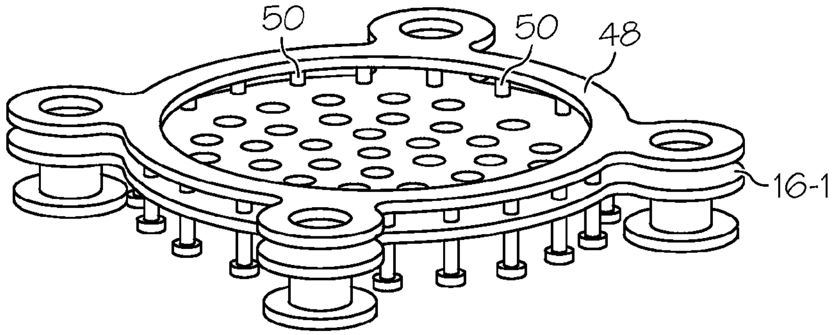
FIG. 14 is a perspective view showing a shield layer on an inner chassis ground layer configuration, according to an embodiment of the present invention.

In order to maintain the Faraday cage with a buried chassis ground ring 16-1, a circular ring 48 may be added on the top layer and a series of vias 50 may be added around the circular ring 48 as shown in FIG. 14. This may allow for much higher pin-to-chassis voltage rating of components (as compared to the surface chassis ground ring 16 described above with reference to FIGS. 4 through 8), allowing the use of this configuration as a filterpin connector where the standard filter connector would not work since they typically have maximum filterpin-to-chassis ratings of about 250 volts maximum.

The connector aperture shielding method and apparatus of the present invention, along with the filterpin connector configuration described above, may reduce electromagnetic emissions from connector apertures, may provide a low cost method for implementing a filterpin configuration, may provide a low cost method of implementing an I/O signal connector doghouse, may provide a filterpin configuration that does not limit the size of the filtering components, and may provide a filterpin configuration that has an increased voltage rating compared to standard, off-the-shelf filterpin connectors.

It should be understood, of course, that the foregoing relates to exemplary embodiments of the invention and that modifications may be made without departing from the spirit and scope of the invention as set forth in the following claims.

We claim:

1. An integrated connector shield ring for shielding an aperture in a shielded enclosure, comprising:
- a chassis ground ring on a printed wiring board; and
- a metal ring having a first end electrically connected to an exterior of a connector in the aperture and a second end adapted to electrically connect to the chassis ground ring, wherein
- the metal ring is adapted to move from an up/inspection position to a down/shielding position.

2. The integrated connector shield ring of claim 1, further comprising female threads on the metal ring, the female threads adapted to mate with male threads on the connector.

3. The integrated connector shield ring of claim 2, further comprising a plurality of stand off pads electrically connecting stand off pads of the chassis ground ring with the connector.

4. The integrated connector shield ring of claim 2, further comprising a conductive sealant disposed to maintain the metal ring in the down/shielding position.

5. The integrated connector shield ring of claim 1, wherein the metal ring is a cylindrical metal ring.

6. The integrated connector shield ring of claim 1, further comprising filtering components disposed on the printed wiring board thereby creating a filterpin connector from the connector.

7. The integrated connector shield ring of claim 6, wherein the filtering components include trace-to-chassis capacitors.

8. The integrated connector shield ring of claim 6, wherein the chassis ground ring blocks re-coupling of noise filtered by the filtering components.

9. The integrated connector shield ring of claim 1, wherein the chassis ground ring is embedded inside the printed wiring board.

10. The integrated connector shield ring of claim 8, further comprising:
- a circular ring disposed on the printed wiring board; and
- a plurality of vias electrically connecting the circular ring with the embedded chassis ground ring, wherein
- the circular ring is adapted to electrically connect to the metal ring when the metal ring is in the down/shielding position.

11. The integrated connector shield ring of claim 1, wherein the metal ring includes a first metal ring with internal threads and a second metal ring with external threads, the external threads mating with the internal threads.

12. The integrated connector shield ring of claim 1, wherein the metal ring includes a first ring half and a second ring half, the first and second ring halves adapted to clamp together.

13. A shielded enclosure having an aperture with a connector, comprising:

a printed wiring board;

a chassis ground ring on the printed wiring board; and a metal ring having a first end electrically connected to an exterior of the connector and a second end adapted to electrically connect to the chassis ground ring, wherein the metal ring is adapted to move from an up/inspection position to a down/shielding position.

14. The shielded enclosure of claim 13, wherein the shielded enclosure is a Faraday cage.

15. The shielded enclosure of claim 13, further comprising female threads on the metal ring, the female threads adapted to mate with male threads on the connector.

16. The shielded enclosure of claim 15, further comprising a plurality of stand offs electrically connecting stand off pads of the chassis ground ring with the connector.

17. A shielded enclosure having an aperture with a filterpin connector, comprising:

a printed wiring board;

a chassis ground ring on the printed wiring board;

a metal ring having a first end electrically connected to an exterior of the connector and a second end adapted to electrically connect to the chassis ground ring; and filtering components disposed on the printed wiring board thereby creating a filterpin connector from the connector, wherein the metal ring is adapted to move from an up/inspection position to a down/shielding position.

18. The shielded enclosure of claim 17, wherein the filtering components include trace-to-chassis capacitors.

19. The shielded enclosure of claim 17, wherein the chassis ground ring blocks re-coupling of noise filtered by the filtering components.

20. The shielded enclosure of claim 17, wherein the size of the filtering components is not limited by the size of the connector.

* * * * *